(12) United States Patent
Beigel et al.

(10) Patent No.: US 8,035,160 B2
(45) Date of Patent: Oct. 11, 2011

(54) RECESSED ACCESS DEVICE FOR A MEMORY

(75) Inventors: Kurt D. Beigel, Boise, ID (US); Jigish D. Trivedi, Boise, ID (US); Kevin G. Duesman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 53 days.

(21) Appl. No.: 12/627,869

(22) Filed: Nov. 30, 2009

(65) Prior Publication Data

US 2010/0072532 A1 Mar. 25, 2010

Related U.S. Application Data

(62) Division of application No. 11/598,449, filed on Nov. 13, 2006, now Pat. No. 7,645,671.

(51) Int. Cl.
*H01L 29/66* (2006.01)
(52) U.S. Cl. .......... 257/330; 257/E29.201; 257/E29.262
(58) Field of Classification Search ........... 257/E29.201, 257/E29.262, 330
See application file for complete search history.

(56) References Cited

U.S. PATENT DOCUMENTS

| | | | |
|---|---|---|---|
| 6,316,299 B1 | 11/2001 | Tung | |
| 6,444,528 B1 | 9/2002 | Murphy | |
| 6,852,597 B2 | 2/2005 | Park et al. | |
| 2004/0266118 A1 | 12/2004 | Han et al. | |
| 2005/0106820 A1 | 5/2005 | Tran | |
| 2005/0139895 A1 | 6/2005 | Koh | |
| 2005/0167741 A1 | 8/2005 | Divakaruni et al. | |
| 2005/0285153 A1 | 12/2005 | Weis et al. | |
| 2006/0001107 A1 | 1/2006 | Kim et al. | |
| 2006/0049455 A1 | 3/2006 | Jang et al. | |
| 2007/0004145 A1 | 1/2007 | Kim et al. | |

FOREIGN PATENT DOCUMENTS

TW 2663307 10/2006

OTHER PUBLICATIONS

PCT/US2007/023767, May 8, 2008, Written Opinion.
PCT/US2007/023767, May 8, 2008, Search Report.
PCT/US2007/023767, May 28, 2009, IPRP.
English translation of Korean Office Action dated Mar. 17, 2011.

*Primary Examiner* — Asok K Sarkar
(74) *Attorney, Agent, or Firm* — Wells St. John P.S.

(57) ABSTRACT

Semiconductor memory devices having recessed access devices are disclosed. In some embodiments, a method of forming the recessed access device includes forming a device recess in a substrate material that extends to a first depth in the substrate that includes a gate oxide layer in the recess. The device recess may be extended to a second depth that is greater that the first depth to form an extended portion of the device recess. A field oxide layer may be provided within an interior of the device recess that extends inwardly into the interior of the device recess and into the substrate. Active regions may be formed in the substrate that abut the field oxide layer, and a gate material may be deposited into the device recess.

34 Claims, 10 Drawing Sheets

RECESSED ACCESS DEVICE FOR A MEMORY

RELATED PATENT DATA

This patent resulted from a divisional application of U.S. patent application Ser. No. 11/598,449, filed Nov. 13, 2006, entitled "Recessed Access Device for a Memory", naming Kurt D. Beigel, Jigish D. Trivedi and Kevin G. Duesman as inventors, the disclosure of which is incorporated by reference.

TECHNICAL FIELD

The information disclosed herein relates generally to integrated circuit devices and fabrication methods, including semiconductor memory devices and methods of forming such devices.

BACKGROUND

Many electronic devices, such as personal computers, workstations, computer servers, mainframes and other computer related equipment such as printers, scanners and hard disk drives use memory devices that provide substantial data storage capability, while incurring low power consumption. One type of memory device that is well-suited for use in the foregoing devices is the dynamic random access memory (DRAM).

Briefly, and in general terms, a DRAM includes a memory array having a plurality of memory cells that can be arranged in rows and columns. A plurality of conductive word lines may be positioned along the rows of the array to couple cells in respective rows, while a plurality of conductive bit lines may be positioned along columns of the array and coupled to cells in the respective columns. The memory cells in the array may include an access device, such as a MOSFET device, and a storage device, such as a capacitor. The access device and the storage device may be operably coupled so that information is stored within a memory cell by imposing a predetermined charge state (corresponding to a selected logic level) on the storage device, and retrieved by accessing the charge state through the access device. Since the charge state in the storage device typically dissipates due to leakage from the cell, the storage device within each memory cell may be periodically refreshed. Current leakage from the cells in the DRAM may occur along several different paths, and if the current leakage is excessive, then the cell refresh interval may be relatively short, which can adversely affect access time for the memory device, and increase the amount of power consumed.

As the cell density of memory devices increases, access devices that are vertically disposed in a supporting substrate are increasingly favored. In general, the vertical access device may be formed in a recess having opposing vertical sidewalls and a horizontal floor extending between the sidewalls. A dielectric layer may then be disposed in the recess, and a gate structure applied. Doped regions may then be formed in the structure to create active (source and drain) regions. Although the vertical access device has a reduced footprint when compared to a laterally-disposed access device, additional difficulties may be introduced. For example, the vertical access device may introduce higher overlap capacitances, and can be subject to higher gate-induced drain leakage (GIDL) currents in the vicinity of the overlap region. GIDL current in the overlap region may be caused by band to band tunneling effects, and can impose significant operating limitations on thin-oxide vertical access devices. Since the tunneling current may be generally exponentially dependent on the electric field present in the active region, small variations in the doping of the active region and/or the oxide thickness in the vertical access device can adversely affect GIDL current.

What is needed in the art are access structures that have the potential to reduce the adverse effects of GIDL currents. Additionally, there is a need in the art for memory devices having improved retention times and lower power consumption.

BRIEF DESCRIPTION OF THE DRAWINGS

The various embodiments of the invention are described in detail below with reference to the following drawings.

FIG. 3 is a schematic view of the memory cell shown in FIG. 2.

DETAILED DESCRIPTION

Many of the various disclosed embodiments relate to memory devices and methods of fabricating such devices, and in particular to recessed access devices for memory devices. Details of the various embodiments are set forth in the following description and in FIGS. 1 through 19 to provide a thorough understanding of such embodiments. One skilled in the art, however, will understand that many additional embodiments exist, and that many may be practiced without several of the details given in the following description.

Figure 1:
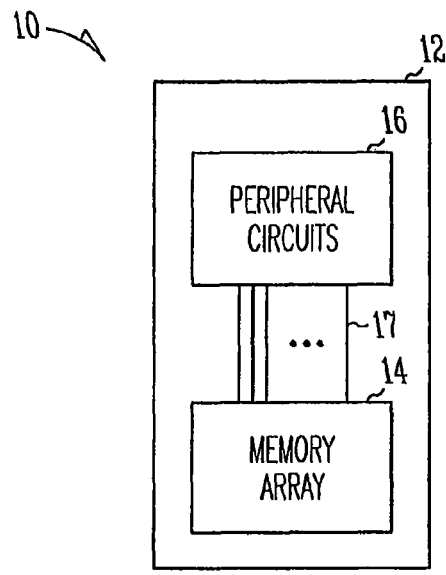
FIG. 1 is a diagrammatic block view of a memory device according to various embodiments.

FIG. 1 is a diagrammatic block view of a memory device 10 according to the various embodiments. The memory device 10 may be formed on a semiconductor substrate 12 by various fabrication methods that include selective masking, photolithography, material deposition, selective doping, planarization and other known fabrication methods. A memory array 14 having a plurality of interconnected memory cells (not shown in FIG. 1) may be disposed on the semiconductor substrate 12 through a selected application of the foregoing fabrication methods. The memory cells included in the memory array 14 may each include an access device that is structured in accordance with the various embodiments, which will be discussed in greater detail below. The memory device 10 may also include one or more peripheral circuits 16 that may be operatively coupled to the memory array 14 by a plurality of control lines 17. The peripheral circuits 16 may include circuits configured to address the memory cells within the memory array 14, so that information may be stored and accessed. Accordingly, the peripheral circuits 16 in the memory device 10 may include sense amplifiers, suitable multiplexing and de-multiplexing circuits, latching circuits, buffer circuits, as well as input and output circuits that are configured to communicate with other external devices. The peripheral circuits 16 may also include various circuits that are operable to supply and/or regulate power to the memory device 10.

Figure 2:
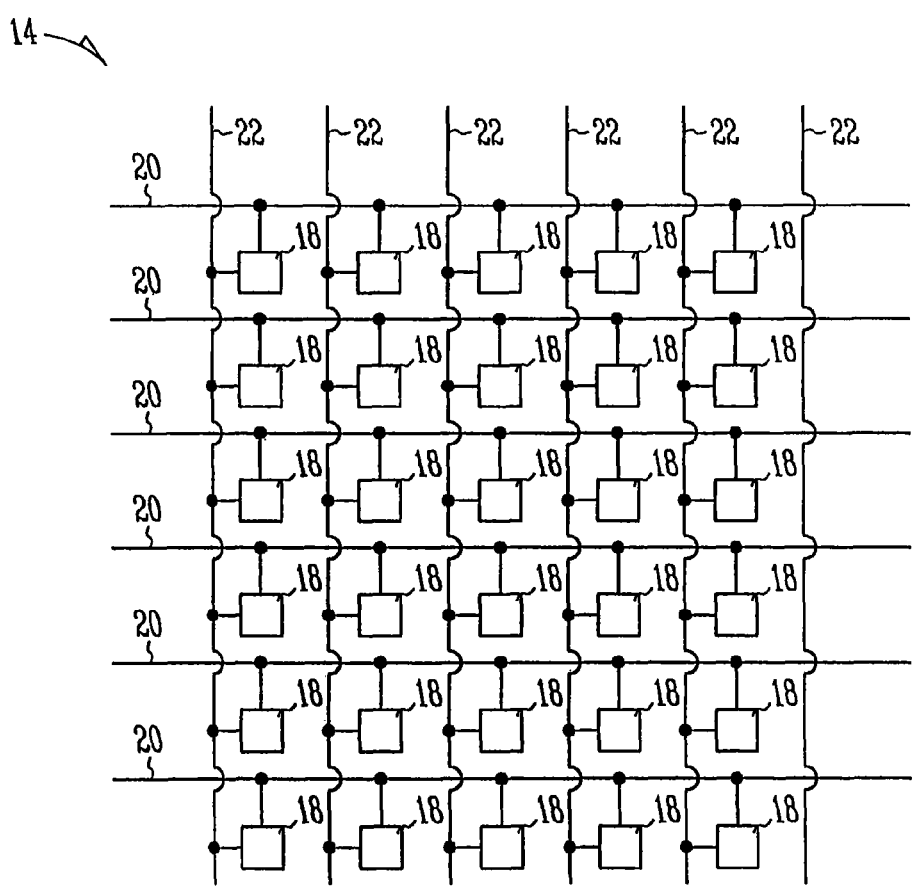
FIG. 2 is a partial schematic view of a memory array shown in FIG. 1.

FIG. 2 is a partial schematic view of the memory array 14 that is shown in FIG. 1. The memory array 14 includes a plurality of memory cells 18 that may be coupled to generally perpendicular word lines 20 and bit lines 22. The word lines 20 and the bit lines 22 may cooperatively form a plurality of address lines, which may be coupled to the peripheral circuits 16 of FIG. 1. The memory cells 18 each may include an access device and a storage device (not shown in FIG. 2) that are operably coupled to respective word lines 20 and respective bit lines 22, as will be discussed in greater detail below. In particular, the access device may be structured in accordance with the various embodiments, which will also be discussed in greater detail below. Although a single memory array 14 is shown, it is understood that the memory array 14 may be segregated into multiple banks, with each bank having dedicated input and output ports that are further coupled to a common internal bus, so that information may be written and accessed from different banks sequentially or simultaneously.

Figure 3:
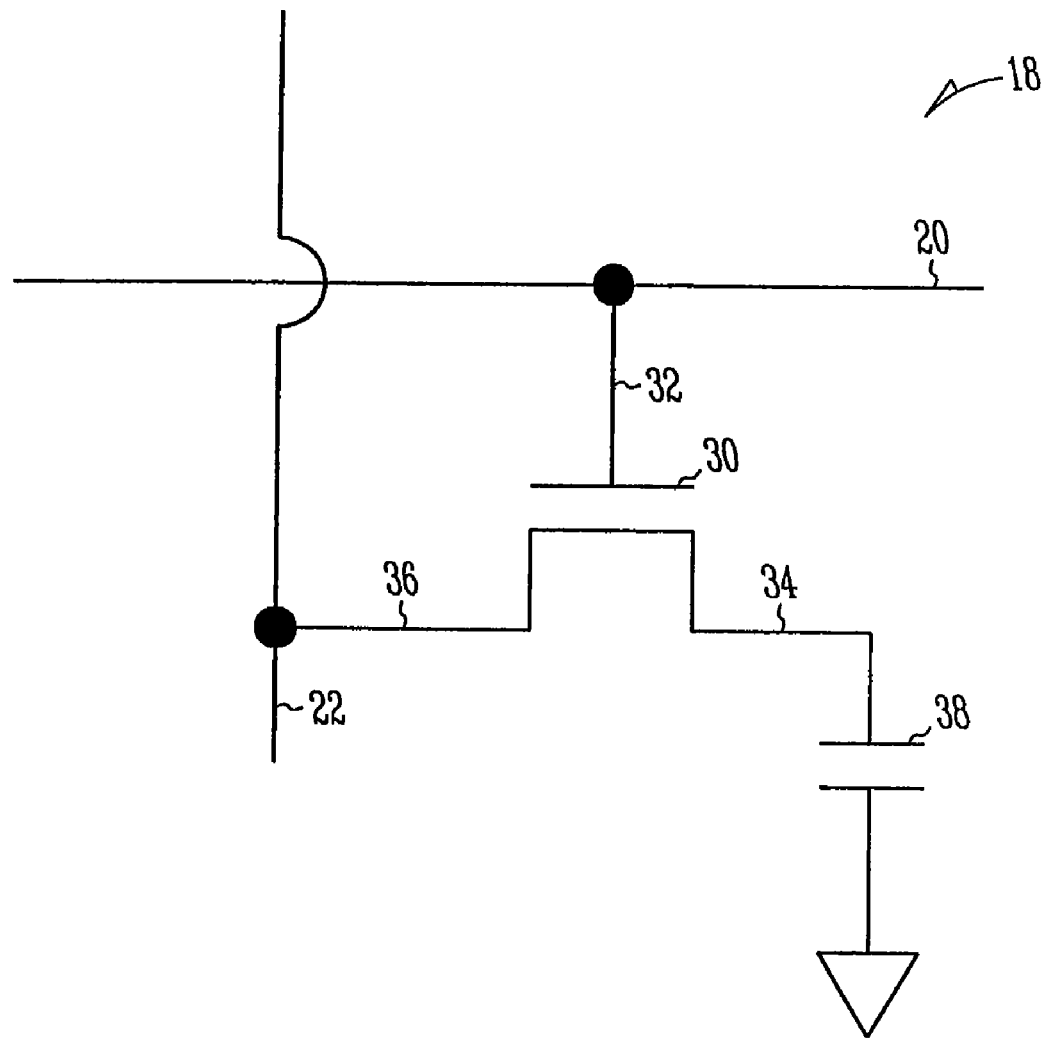
FIG. 3 is a schematic view of a memory cell from the array shown in FIG. 2.

FIG. 3 is a schematic view of the memory cell 18 shown in FIG. 2. The memory cell 18 may include an access device 30, which may be a metal oxide semiconductor field effect transistor (MOSFET). Accordingly, the access device 30 may be a p-MOSFET device if a channel region is comprised of a p-type semiconductor material, or alternately, an n-MOSFET device if the channel region is comprised of an n-type semiconductor material. In either case, the access device 30 may be formed by suitably processing the semiconductor substrate 12 (shown in FIG. 1), which includes suitably doping regions of the substrate 12 to form the access device 30. The access device 30 may be operably coupled to other portions of the memory cell 18 by forming various interconnections within each cell 18. The interconnections may be formed from a selected metal, or alternately, from other conductive materials, such as polysilicon. Again, the access device 30 is structured in accordance with various embodiments, which will be discussed in greater detail below. The memory cell 18 may also include a storage device 38 that is coupled to the access device 30. The storage device 38 may be a capacitive structure having a suitably large capacitance, so that an adequate signal may be communicated to the peripheral circuits 16 (FIG. 1) by the access device 30. Accordingly, the storage device 38 may include three-dimensional capacitive structures, such as trench and stacked capacitive structures. For example, the storage device 38 may include the three-dimensional capacitive device disclosed in U.S. Pat. No. 6,635,540 to DeBoer, et al., and entitled "DRAM Capacitor Formulation Using a Double-Sided Electrode", which patent is herein incorporated by reference.

Figure 4:
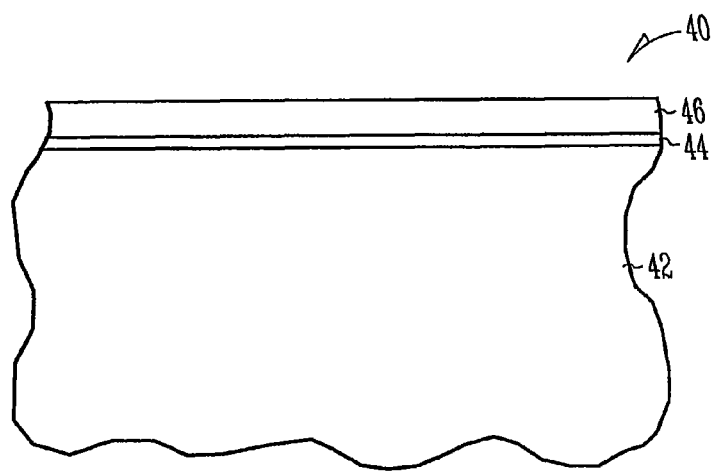
FIGS. 4 through 17 are partial cross sectional views of a semiconductor substrate that illustrate several methods of forming a recessed access device.

FIGS. 4 through 17 will now be used to illustrate several methods of forming a memory device 40 having a recessed access device, according to the various embodiments. FIG. 4 is a partial cross sectional view of a semiconductor substrate 42. The semiconductor substrate 42 may include any semiconductor-based structure having a semiconductor surface, which may include a bulk silicon substrate, a silicon on insulator (SOI) substrate, and a silicon on sapphire (SOS) substrate. The substrate 42 may include doped and undoped semiconductor materials, and/or epitaxial layers of silicon supported on a semiconductor base. Moreover, the material comprising the semiconductor substrate 42 need not be entirely silicon based. For example, the substrate 42 may also include portions formed entirely from germanium, or from silicon and germanium in combination, or from gallium arsenide. A pad oxide layer 44 is applied to a surface of the semiconductor substrate 42, and is followed by the application of a silicon nitride layer 46. The pad oxide layer 44 may include a silicon dioxide ($SiO_2$) layer that may be generated by a wet or a dry oxidation process, while the silicon nitride layer 46 may be thermally grown by exposing the substrate 42 to a nitriding atmosphere at an elevated temperature.

Figure 5:
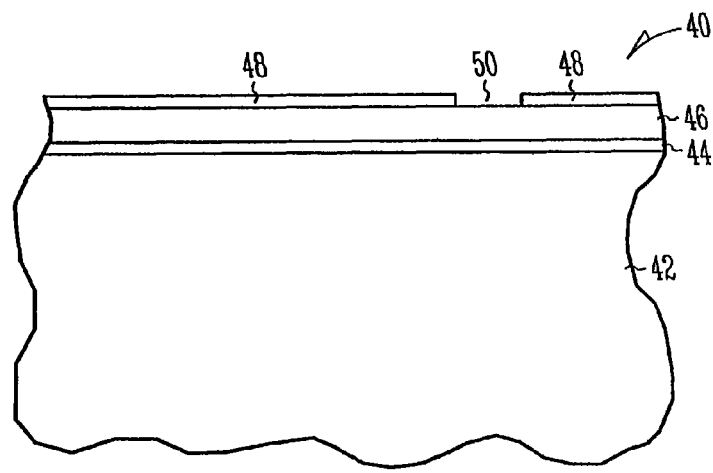
Figure 6:
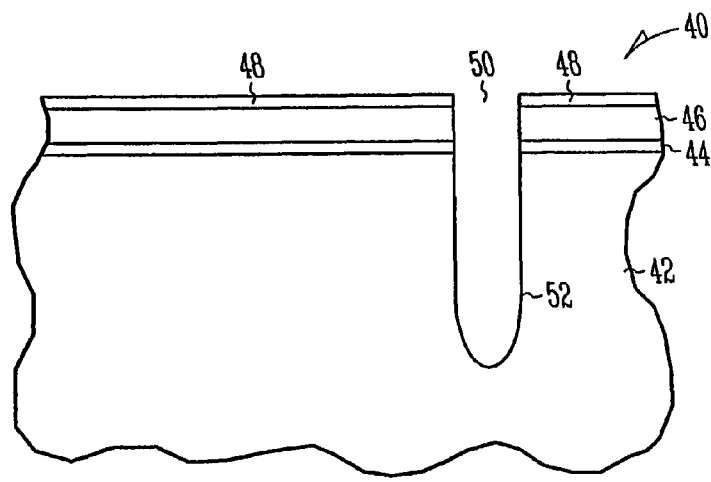

FIG. 5 is a partial cross sectional view of the memory device 40 that shows the addition of a photoresist layer 48 to the silicon nitride layer 46. The photoresist layer 48 may be suitably patterned to form an opening in the layer 48 by various methods, which may include exposing the photoresist layer 48 through a mask using a suitable illumination source, and developing the exposed photoresist layer 48 to generate the opening, which defines an isolation region 50. The substrate 42 is etched at a location of the isolation region 50 to form an isolation recess 52 having a suitable depth, as shown in FIG. 6. For example, the isolation recess 52 may be etched into the substrate 42 using an isotropic wet etch, an anisotropic dry etch, or by other suitable methods.

Figure 7:
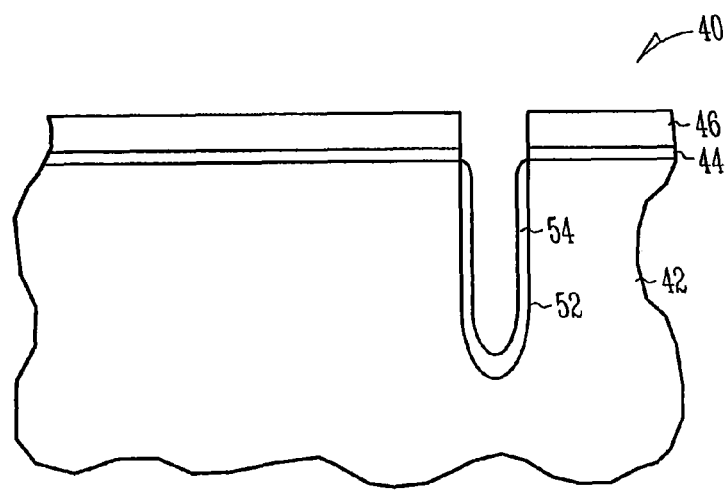
Figure 8:
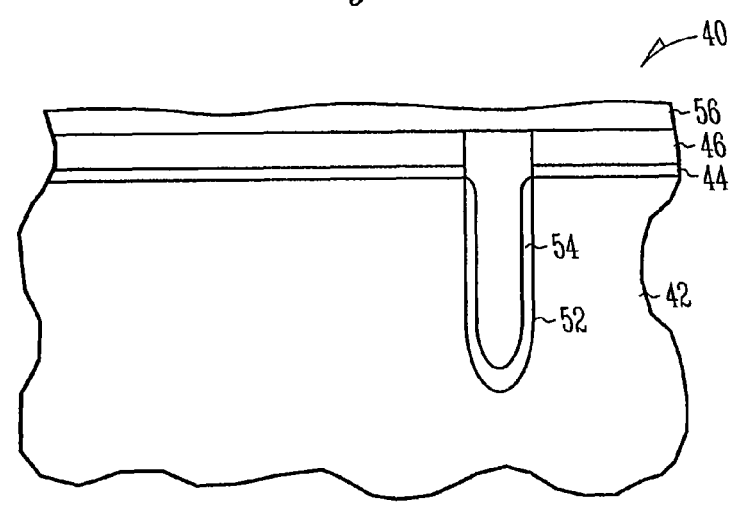
Figure 9:
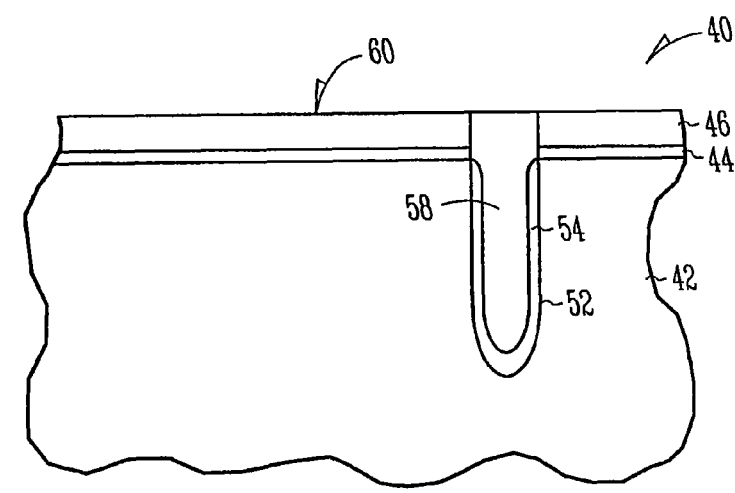

Referring now to FIG. 7, the photoresist layer 48 (not shown) is stripped from the memory device 40, and the sidewall portions of the isolation recess 52 are oxidized to form an oxide layer 54, such as a silicon dioxide ($SiO_2$) layer, using a wet oxidation process employing water vapor maintained at a suitable elevated temperature. Alternately, a dry oxidation process may also be used. A dielectric material 56 is applied to the silicon nitride layer 46 that substantially fills the isolation recess 52 (FIG. 8). The dielectric material 56 may also include silicon dioxide that is deposited using Chemical vapor Deposition (CVD); other known dielectric materials may also be used. For example, the dielectric material 56 may include the Dow Corning Spin On STI, available from Dow Corning, Inc. of Midland, Mich. Following the application of the dielectric material 56, excess portions of the material 56 may be removed from the device 40, as shown in FIG. 9, leaving remnant dielectric material 58. For example, the excess portions may be removed by planarizing the device 40 using Chemical Mechanical Planarization (CMP), with a surface 60 of the layer 46 being used as an end pointing surface.

Figure 10:
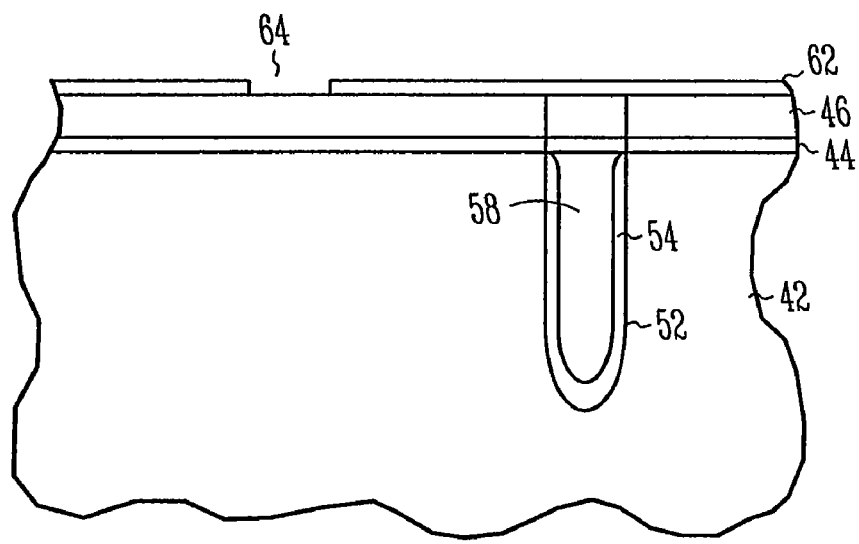
Figure 11:
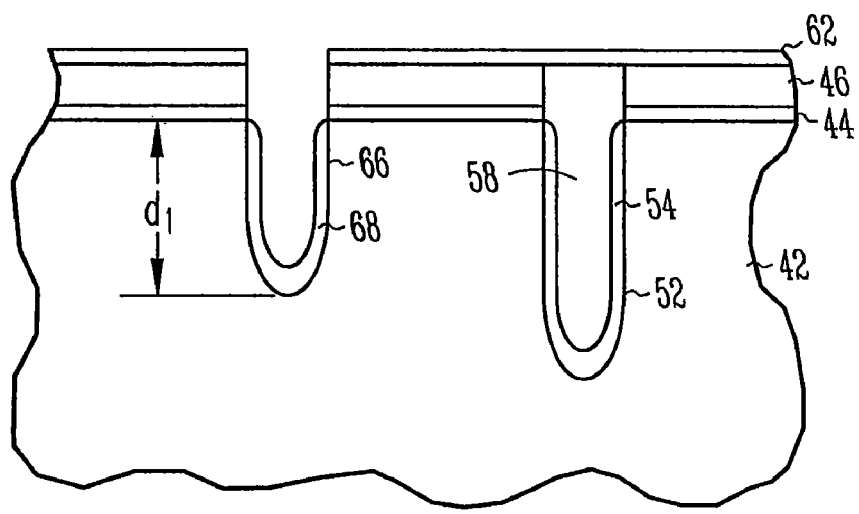
Figure 12:
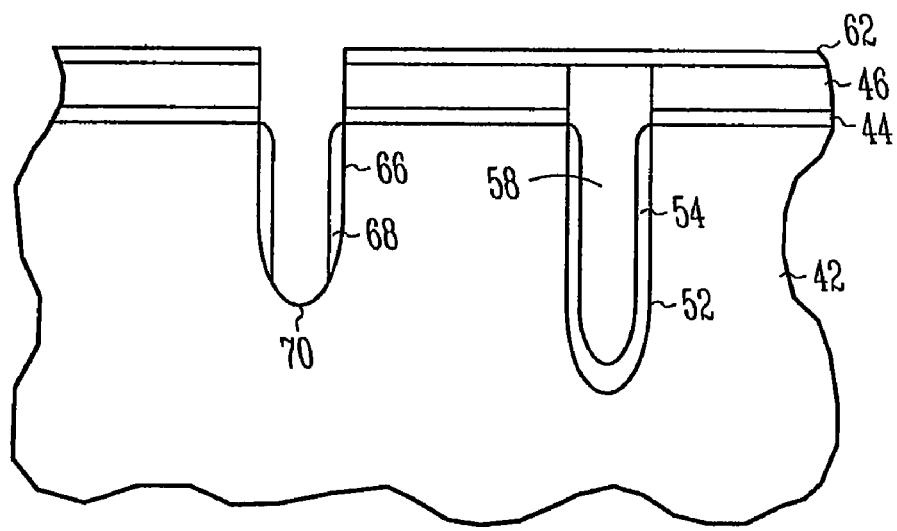
Figure 13:
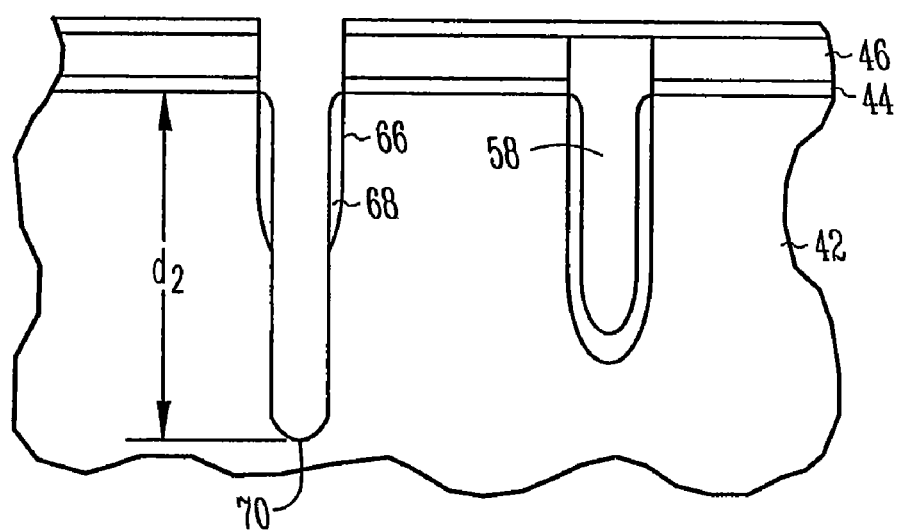

A photoresist layer 62 is applied to the device 40 and suitably patterned to form an opening in the layer 62 that defines an access device region 64, as shown in FIG. 10. The region 64 may then be etched to remove the pad oxide layer 44 and the nitride layer 46 in the region 64. The substrate 42 may be anisotropically etched using a wet etching process, such as an anisotropic potassium hydroxide (KOH) etch, to a desired first depth $d_1$ so that an access device recess 66 is formed, as shown in FIG. 11. The interior walls of the recess 66 may then be oxidized to form a gate oxide layer 68. The gate oxide layer 68 may include a silicon dioxide layer ($SiO_2$) that is formed by a wet or a dry oxidation process. In FIG. 12, a portion of the gate oxide layer 68 may be selectively spacer-etched from a bottom portion 70 of the recess 66. For example, the layer 68 may be spacer etched using a dry etch process. In FIG. 13, the access device recess 66 may be further etched to a desired second depth $d_2$ by an anisotropic etch process, such as a wet etching process. The recess 66 is thus extended further into the substrate 42.

Figure 14:
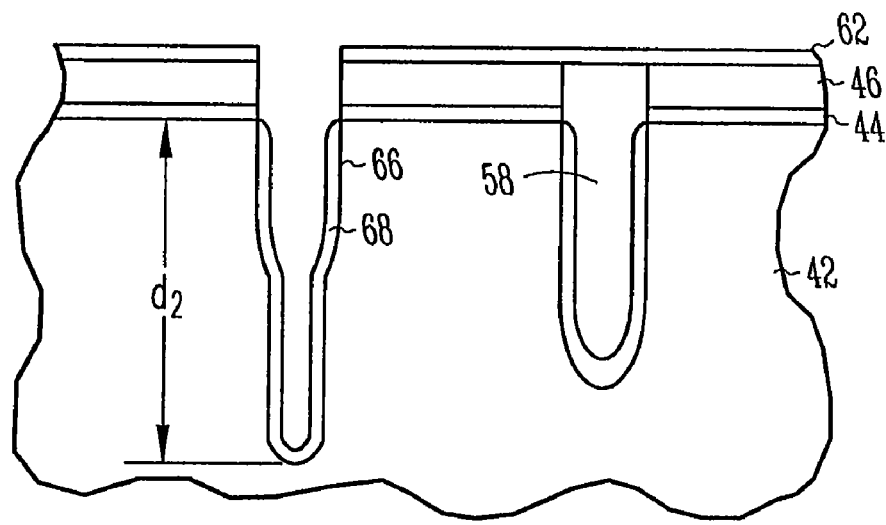
Figure 15:
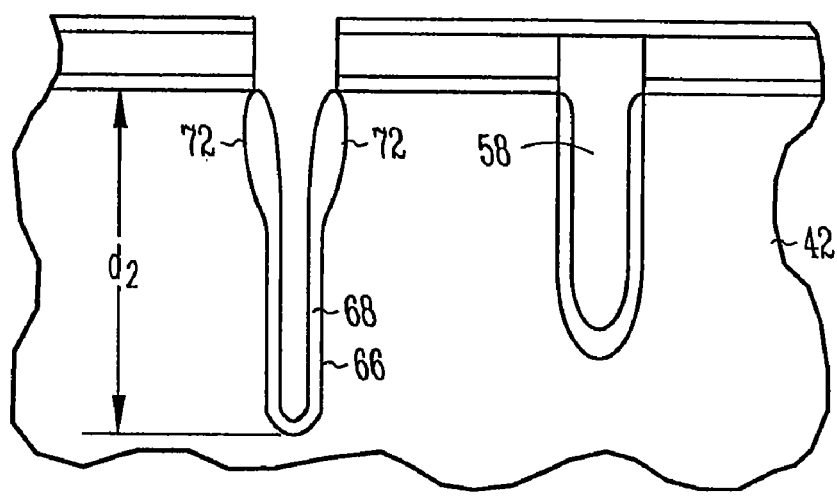
Figure 16:
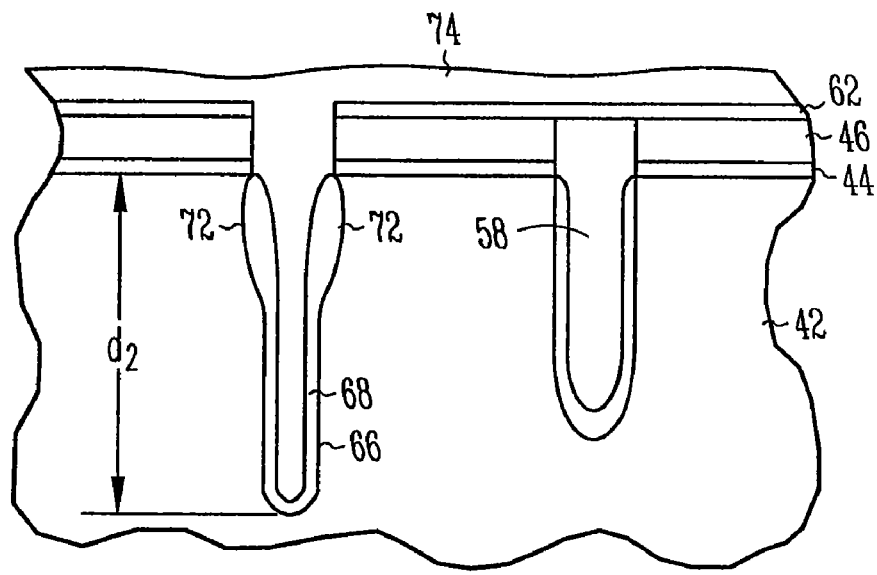

Turning now to FIG. 14, the interior portions of the recess 66 may be oxidized so that the gate oxide layer 68 extends downwardly into the recess 66 to the second depth $d_2$. A silicon cleaning procedure may be applied to the device 40, which may include generally known cleaning solutions, such as solutions that include sulfuric acid ($H_2SO_4$), hydrofluoric acid (HF), hydrochloric acid (HCl), deionized water, and other known cleaning agents. A further oxidation procedure may then be performed within the recess 66 to generate a field oxide layer 72 in the recess 62. The field oxide layer 62 extends inwardly into the recess 62, and also into the substrate 42, as shown in FIG. 15. Accordingly, the field oxide layer 62 includes a relatively thick layer of a dielectric material that is positioned in an upper portion of the recess 66 so that the field oxide layer 62 is positioned between an interior of the recess 66 and active regions formed in the substrate 42, which will be subsequently described. The field oxide layer 72 may be thermally grown by known methods, including wet and dry oxidation. Following the formation of the field oxide layer 72, a gate material 74 may be applied, as shown in FIG. 16, which substantially fills the recess 62. The gate material 74 may include a polysilicon layer, which may be doped with a selected chemical species to impart a desired conductivity, or it may be undoped. If the gate material 74 is polysilicon, a chemical vapor deposition (CVD) method using a silane reaction gas may be used to deposit the polysilicon.

Figure 17:
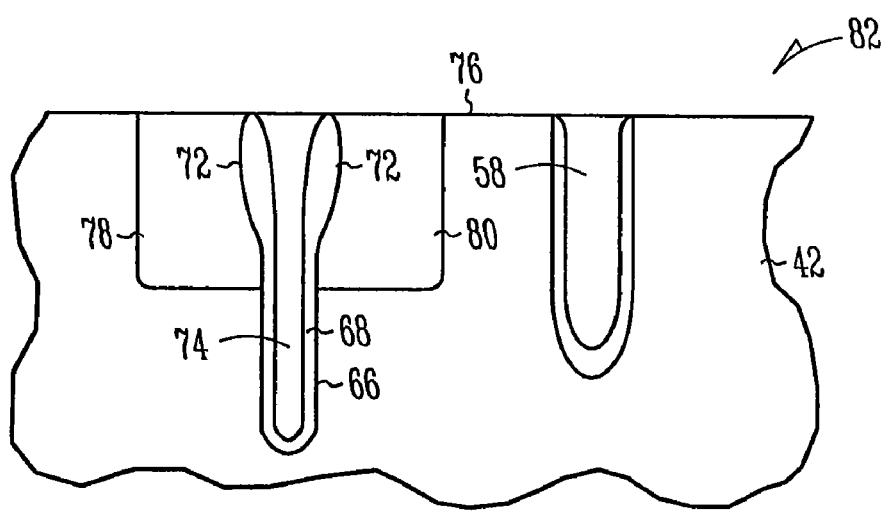
Figure 18:
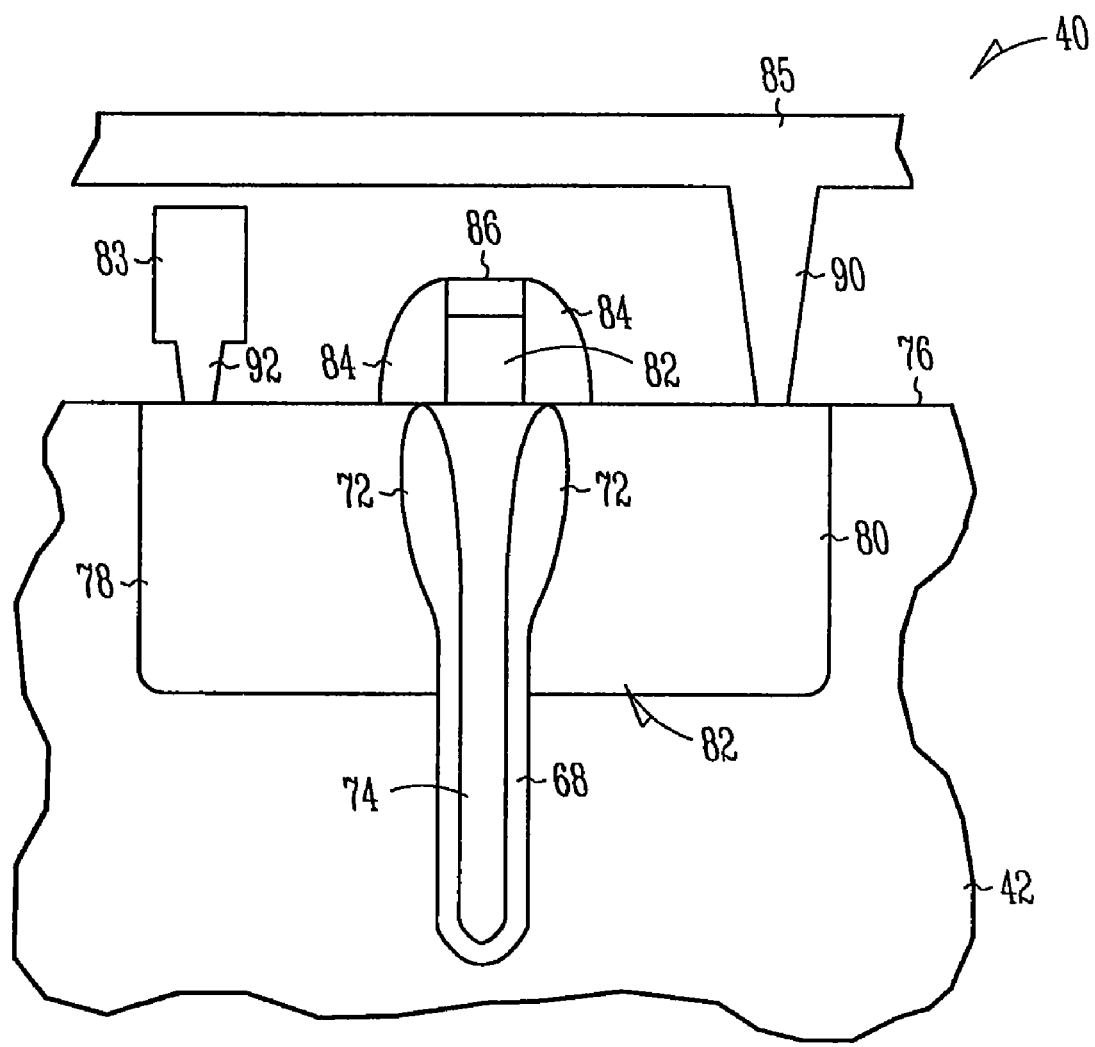
FIG. 18 is a partial cross sectional view of a memory device having a recessed access device according to various embodiments.

FIG. 17 is a partial cross sectional view of the substrate 42 after excess portions of the gate material 74, the photoresist layer 62, the silicon nitride layer 46 and the pad oxide layer 44 have been removed. The substrate 42 may then be selectively doped by appropriately masking selected areas of a surface 76 of the substrate 42 with a doping barrier (not shown in FIG. 17). Accordingly, locations for active areas may be defined on the substrate 42. One suitable doping barrier may include a photoresist layer that is suitably patterned to reveal the selected areas of the surface 76. Alternately, a silicon dioxide layer or a silicon nitride layer may also be generated on the surface 76, and then selectively removed by patterning openings through a photoresist layer at the active area locations, and subsequently etching the exposed silicon dioxide or silicon nitride layer. In either case, the selected areas on the surface 76 may be selectively doped to form active regions, such as a first doped region 78 and a second doped region 80 that extend into the substrate 42. Although FIG. 17 shows the first doped region 78 and the second doped region 80 extending into the substrate 42 to approximately equal depths, it is understood that the respective regions may extend into the substrate 42 to different depths, if desired. Moreover, the doping concentration in the first doped region 78 may be different from the doping concentration in the second doped region 80. Suitable doping methods may include, for example, ion implantation of a selected chemical species into the first doped region 78 and the second doped region 80. Suitable chemical species may include, for example, species including phosphorous, arsenic and boron ions, although other suitable chemical species may also be used.

In the various embodiments, the first doped region 78 may be doped with arsenic or phosphorous ions to have a first n-type conductivity, while the second doped region 80 may also be doped with phosphorous ions to have a second n-type conductivity, with the first n-type conductivity being different than the second n-type conductivity. Accordingly, an n-conductivity may be established in the first doped region 78, while an n-conductivity is established in the second doped region 80, where it is understood that the terms n-conductivity and n-conductivity are understood to refer to relative conductivity levels established in the first doped region 78 and the second doped region 80. In several of the embodiments, the substrate 42 may also be selectively doped with boron ions, so that a p-type conductivity is established in the substrate 42. If the gate material 74 is polysilicon, then it may also be doped to any desired degree to provide a p-type or an n-type conductivity, or it may be applied to the substrate 42 in a relatively un-doped state. Following the selective doping of the first doped region 78, the second doped region 80 and the gate material 74, the doping barrier may be removed by stripping the barrier from the substrate 42.

Although not shown in FIG. 17, it is understood that various additional structures may be formed on the surface 76 of the substrate 42 to provide interconnections between the recessed access device 82 and other portions of the memory cell 18 of FIG. 3. For example, and referring now to FIG. 18, a word line 82 may be positioned on the gate material 74 by depositing a conductive material on the surface 76 that abuts the gate material 74. The conductive material may include a metal, or a silicide. Opposing first insulation structures 84 may be formed on the surface 76 that may be positioned on respective sides of the word line 82, while a second insulation structure 86 may be positioned adjacent to the word line 82 and between the first insulation structures 84 to suitably electrically isolate the word line 82. The first doped region 78 may be electrically coupled to a storage device 83 through a suitable structure 92, such as a metal via, or other conductive structures. The second doped region 80 may be coupled to a bit line 85 through a structure 90, which may include a metal via, or other conductive structures. Although not shown in FIG. 18, it is understood that one or more isolation recesses 52, as shown in FIG. 12, for example, may also be positioned adjacent to the recessed access device 82.

Figure 19:
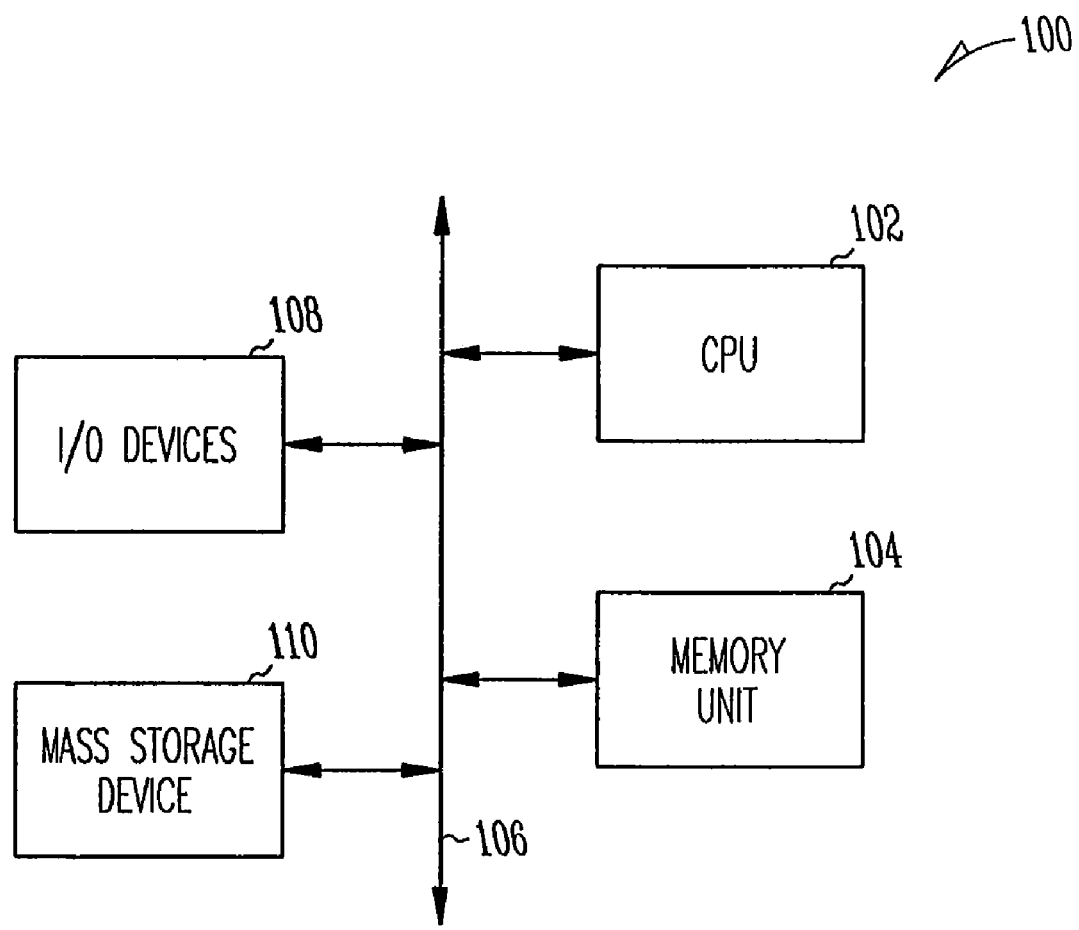
FIG. 19 is a diagrammatic block view of a processing system according to various embodiments.

FIG. 19 is a diagrammatic block view of a processing system 100 according to the various embodiments. The processing system 100 includes a central processing unit (CPU) 102, which may include any digital device capable of receiving data and programmed instructions, and processing the data according to the programmed instructions. Accordingly, the CPU 102 may include a microprocessor, such as a general purpose single-chip or multi-chip microprocessor, or it may include a digital signal processing unit, or other similar programmable processing units. The CPU 102 is generally configured to communicate with a memory unit 104 over a communications bus 106. The memory unit 104 includes a recessed access device that is structured and formed in accordance with the various embodiments, such as, for example, the recessed access device 82 that is shown in FIG. 17. The processing system 100 may also include various other devices that are operably coupled to the bus 106, which are configured to cooperatively interact with the CPU 102 and the memory unit 104. For example, the processing system 100 may include one or more input/output (I/O) devices 108, such as a printer, a display device, a keyboard, a mouse, or other known input/output devices. The processing system 100 may also include a mass storage device 110, which may include a hard disk drive, a floppy disk drive, an optical disk device (CD-ROM), or other similar devices. The processing system 100 may be at least partially formed on a semiconductor wafer, which may further include a plurality of dies formed on the wafer, such as a system-on-chip (SOC).

While the various embodiments of the invention have been illustrated and described, as noted above, many changes can be made. For example, although several embodiments of the vertical access device are described with reference to a DRAM memory device, it is understood that the several embodiments may also be incorporated, without significant modification, in a wide variety of other memory devices, such as a static memory, a dynamic memory, such as a dynamic random access memory (DRAM), an extended data out (EDO) DRAM, a synchronous dynamic random access memory, a double data rate synchronous dynamic random access memory (DDR SDRAM), a synchronous link dynamic random access memory (SLDRAM), a video random access memory (VRAM), a RAMBUS dynamic random access memory (RDRAM), a static random access memory (SRAM), a flash memory, as well as other known memory devices.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although several embodiments have been illustrated and described herein, it should be appreciated that any arrangement calculated to achieve the same purpose may be substituted for the several embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A memory device, comprising:
   at least one peripheral circuit positioned on a semiconductor substrate; and
   a memory array formed on the substrate that is operably coupled to the at least one peripheral circuit, the memory array including a recessed access device, the recessed device further comprising:
   a device recess formed in the substrate that extends to a first depth and including a gate oxide layer formed in the recess;
   an extended portion of the device recess that extends to a second depth that is greater that the first depth;
   a field oxide layer positioned within an interior of the device recess that extends inwardly into the interior of the device recess and into the substrate;
   active regions formed in the substrate that abut the field oxide layer; and
   a gate structure positioned in the device recess.

2. The memory device of claim 1, further comprising at least one dielectric layer positioned on a surface of the semiconductor substrate.

3. The memory device of claim 1, wherein the field oxide layer further comprises a field oxide layer having a thickness that is at least two times the thickness of the gate oxide layer.

4. The memory device of claim 1, wherein the active regions in the substrate that abut the field oxide layer further comprise a first doped region and an opposing second doped region having a selected conductivity.

5. The memory device of claim 4, wherein the first doped region and the opposing second doped region further comprise a first doped region that includes a first conductivity and a second doped region that includes a second conductivity that is different from the first conductivity.

6. The memory device of claim 4, wherein the first doped region and the opposing second doped region further comprises one of the first doped region and the second doped region having an n-conductivity, and the other one of the first doped region and the second doped region having an n-conductivity.

7. The memory device of claim 1, wherein the gate structure further comprises one of a doped polysilicon material and an undoped polysilicon material.

8. The memory device of claim 1, wherein the semiconductor substrate further comprises a substrate having a selected conductivity.

9. The memory device of claim 8, wherein the substrate having a selected conductivity further comprises a substrate having a p-conductivity.

10. The memory device of claim 1, further comprising:
    at least one isolation recess adjacent the device recess;
    an oxide layer positioned within the isolation recess; and
    a dielectric material substantially occupying the isolation recess.

11. The memory device of claim 1, further comprising:
    a storage device coupled to a selected one of the active areas by a via that extends between the storage device and the selected one of the active areas;
    a via that extends between the other of the active areas configured to couple a bit line of the memory device to the other of the active areas; and
    a conductive material positioned on the gate structure that couples the gate structure to a word line of the memory device.

12. The memory device of claim 11, wherein the storage device further comprises one of a trench capacitor and a stacked capacitor.

13. The memory device of claim 11, further comprising:
    first insulation structures positioned on opposing sides of the conductive material positioned on the gate structure.

14. The memory device of claim 13, further comprising:
    a second insulation structure positioned between the first insulation structures that abuts the conductive material positioned on the gate structure.

15. The memory device of claim 1, wherein the at least one peripheral circuit further comprises at least one sense amplifier, a multiplexer and de-multiplexer circuit, a latching circuit, a buffer circuit, and an input and an output circuit.

16. A memory array for a memory device, comprising:
    a plurality of memory cells formed on a semiconductor substrate and coupled to word lines and generally perpendicular bit lines formed on the substrate, wherein at least some of the plurality of memory cells comprise:
    a storage device; and
    a recessed access device formed in the substrate that is coupled to the storage device and to a selected one of the word lines and a selected one of the bit lines, the recessed access device further comprising:
    a device recess formed in the substrate that extends to a first depth and including a gate oxide layer formed in the recess;

an extended portion of the device recess that extends to a second depth that is greater that the first depth;

a field oxide layer positioned within an interior of the device recess that extends inwardly into the interior of the device recess and into the substrate;

active regions formed in the substrate that abut the field oxide layer; and a gate structure positioned in the device recess.

17. The memory array of claim 16, further comprising at least one dielectric layer positioned on a surface of the semiconductor substrate.

18. The memory array of claim 16, wherein the field oxide layer further comprises a field oxide layer having a thickness that is at least two times the thickness of the gate oxide layer.

19. The memory array of claim 16, wherein the active regions in the substrate that abut the field oxide layer further comprise a first doped region and an opposing second doped region having a selected conductivity.

20. The memory array of claim 19, wherein the first doped region and the opposing second doped region further comprise a first doped region that includes a first conductivity and a second doped region that includes a second conductivity that is different from the first conductivity.

21. The memory array of claim 19, wherein the first doped region and the opposing second doped region further comprises one of the first doped region and the second doped region having an n-conductivity, and the other one of the first doped region and the second doped region having an n-conductivity.

22. The memory array of claim 16, wherein the gate structure further comprises one of a doped polysilicon material and an undoped polysilicon material.

23. The memory array of claim 16, wherein the semiconductor substrate further comprises a substrate having a selected conductivity.

24. The memory array of claim 23, wherein the substrate having a selected conductivity further comprises a substrate having a p-conductivity.

25. The memory array of claim 16, further comprising:
at least one isolation recess adjacent the device recess;
an oxide layer positioned within the isolation recess; and
a dielectric material substantially occupying the isolation recess.

26. A processing system at least partially formed on a semiconductor chip, comprising:
a central processing unit (CPU); and
a memory device operably coupled to the CPU by a communications bus, the memory device including at least one recessed access device further comprising:
a device recess formed in the substrate that extends to a first depth and including a gate oxide layer formed in the recess;
an extended portion of the device recess that extends to a second depth that is greater that the first depth;
a field oxide layer positioned within an interior of the device recess that extends inwardly into the interior of the device recess and into the substrate;
active regions formed in the substrate that abut the field oxide layer; and
a gate structure positioned in the device recess.

27. The system of claim 26, wherein the field oxide layer further comprises a field oxide layer having a thickness that is at least two times the thickness of the gate oxide layer.

28. The system of claim 26, wherein the active regions in the substrate that abut the field oxide layer further comprise a first doped region and an opposing second doped region having a selected conductivity.

29. The system of claim 28, wherein the first doped region and the opposing second doped region further comprise a first doped region that includes a first conductivity and a second doped region that includes a second conductivity that is different from the first conductivity.

30. The system of claim 28, wherein the first doped region and the opposing second doped region further comprises one of the first doped region and the second doped region having an n-conductivity, and the other one of the first doped region and the second doped region having an n-conductivity.

31. The system of claim 26, wherein the gate structure further comprises one of a doped polysilicon material and an undoped polysilicon material.

32. The system of claim 26, further comprising:
at least one isolation recess adjacent the device recess;
an oxide layer positioned within the isolation recess; and
a dielectric material substantially occupying the isolation recess.

33. The system of claim 26, further comprising at least one input/output (I/O) device and a mass storage device operably coupled to the communications bus.

34. The system of claim 33, wherein the at least one I/O device includes at least one of a printer, a display device, a keyboard and a mouse, and further wherein the mass storage device includes at least one of a hard disk drive, a floppy disk drive and an optical disk drive.

* * * * *